United States Patent [19]

Hellwig et al.

[11] 4,376,683
[45] Mar. 15, 1983

[54] METHOD AND DEVICE FOR THE PARTIAL GALVANIZATION OF SURFACES WHICH ARE CONDUCTING OR HAVE BEEN MADE CONDUCTING

[75] Inventors: Hubertus Hellwig, Munich; Hans-Joachim Schuster; Klaus-Dieter Heppner, both of Berlin, all of Fed. Rep. of Germany

[73] Assignee: Siemens Aktiengesellschaft, Berlin & Munich, Fed. Rep. of Germany

[21] Appl. No.: 249,028

[22] Filed: Mar. 30, 1981

[30] Foreign Application Priority Data

Apr. 21, 1980 [DE] Fed. Rep. of Germany ....... 3015282

[51] Int. Cl.³ .................. C25D 5/02; C25D 17/00
[52] U.S. Cl. ............................... 204/15; 204/224 R
[58] Field of Search ............... 204/224 R, 275, 15

[56] References Cited

U.S. PATENT DOCUMENTS

| | | | |
|---|---|---|---|
| 2,698,832 | 1/1955 | Swanson | 204/224 R |
| 3,546,088 | 12/1970 | Barkman | 204/224 R |
| 3,644,181 | 2/1972 | Donaldson | 204/224 R |
| 3,933,615 | 1/1976 | Levenson | 204/275 |
| 4,033,833 | 7/1977 | Bestel et al. | 204/15 |
| 4,083,755 | 4/1978 | Murata | 204/15 |

FOREIGN PATENT DOCUMENTS

| | | |
|---|---|---|
| 850972 | 5/1951 | Fed. Rep. of Germany. |
| 2551988 | 5/1977 | Fed. Rep. of Germany. |
| 1393138 | 5/1975 | United Kingdom. |

*Primary Examiner*—T. Tufariello
*Attorney, Agent, or Firm*—Hill, Van Santen, Steadman, Chiara & Simpson

[57] ABSTRACT

Method and device for the partial galvanization of a surface of a conductive material is disclosed. A flow-on channel and a flow-off channel are positioned at an angle relative to the surface at less than 45° and arranged to direct the electrolyte solution at an angle onto the surface to be treated. The electrolyte is removed at an angle to the surface by the flow-off channel such that on the surface to be treated a substantially laminar flow arises. The flow-on channel and flow-off channel are constructed of a corrosion-resistant material. A metallic anode element is arranged in at least one of the flow-on and flow-off channels adjacent the area to be treated.

10 Claims, 2 Drawing Figures

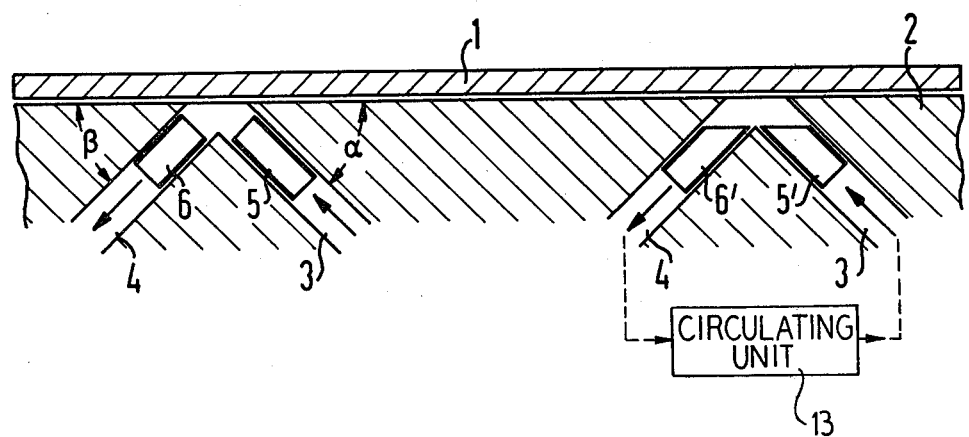
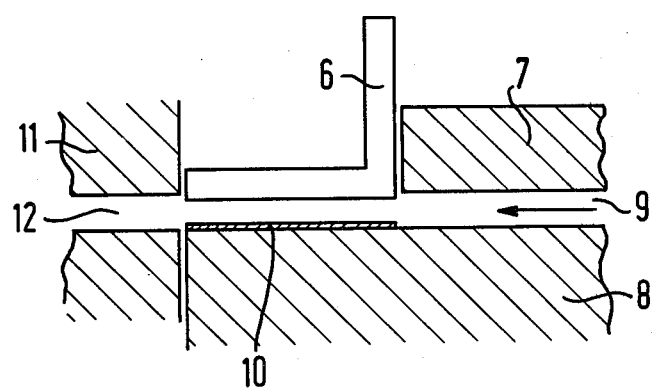

METHOD AND DEVICE FOR THE PARTIAL GALVANIZATION OF SURFACES WHICH ARE CONDUCTING OR HAVE BEEN MADE CONDUCTING

BACKGROUND OF THE INVENTION

The invention concerns a method for the partial galvanization of surfaces which are conducting or have been made conducting by means of deposition of metals or their alloys from electrolyte solutions. The electrolyte solution flows with a high velocity out of a nozzle onto the surface which is to be treated.

Methods for partial galvanization generally require complicated and expensive devices so that their use is acceptable as a rule only in the case of noble metals, for economic reasons. So that the galvanization process for a predetermined layer thickness takes as little time as possible, high flow velocities of the electrolytes and high current densities are aimed for, since only in this manner can high deposition velocities be attained.

Numerous methods and devices for the partial galvanization have become known, their main feature consisting in that the nozzles are aimed vertically against the surface to be treated. It is further known that the nozzles, or respectively parts of the same, are connected as anodes and the surfaces to be treated are connected as cathodes. So that in the case of a vertical arrangement of the jets the electrolyte can flow off, the nozzle must be arranged at a corresponding spacing from the surface to be treated, that is, the electrolyte leaves the nozzle as a free jet.

By means of German Patent No. 850,972, incorporated herein by reference, a device is known for the generation of varyingly thick galvanic deposits whereby the electrolyte in the form of a free jet reacts on the surface to be treated. Accordingly, the electrolyte flows through an annular electrode which is arranged in the jet, which is connected as an anode, while the part to be treated is connected as a cathode.

In order to limit the galvanization to specific parts of the surfaces, in the German OS No. 2,551,988, incorporated herein by reference, besides this it was proposed that the jet be surrounded by a tubular shell so that the electrolyte stream which is rebounded back from the surface to be galvanized can flow back between the jet and the shell into a collecting container.

A method and a device became known from German OS No. 2,648,274, incorporated herein by reference, whereby the electrolyte stream which is aimed perpendicularly against the surface to be treated is supplied via a conduit in which a tube shaped metal anode-electrode is arranged. In the case of this known embodiment, the end of the nozzle is equipped with an annular part for deflection of the stream, which part serves as a dielectric. In this manner, a specific flow line distribution of the electrolyte stream is to be forced.

It is further known, for example, by means of German AS No. 2,232,333 and U.S. Pat. No. 4,083,755, both incorporated herein by reference, that the surface regions to be galvanized are screened by masks or such. In the case of these known devices, the openings of the masks or such associated to the nozzles are designed in a truncated cone shape in order to make the shunting of the electrolytes easier.

Finally, a device is known from U.S. Pat. No. 3,933,615, incorporated herein by reference, for the etching and galvanizing of printed circuit boards whereby, for the simultaneous treatment of both sides of the circuit board, on each side of the same there is arranged an electrolyte chamber which on the side turned toward the circuit board displays a slot which extends over the length of the same, out of which the electrolyte exits at an obtuse angle against the circuit board and flows off along this downward. The electrolyte chambers consisting of insulating material do not lie directly on the circuit plate or board, but rather over intermediate layers of insulating material, the thickness of which is dimensioned such that the electrolyte streams flowing off downward are guided through the electrodes which are arranged directly under the electrolyte chambers. Accordingly, the electrode which extends over the total slot width of the electrolyte chamber closes snugly with the side of the electrolyte chamber which is turned toward the circuit plate or board. In this manner, there thus arises a sort of drainage channel which ends in a pool. This structural design permits an increased velocity of flow for the electrolytes. However, then there arise considerable turbulent flows on what is to be treated.

As was already mentioned in the beginning, a high deposition velocity during galvanization requires a high relative movement between the surface to be coated and the electrolytes, in order to prevent a depletion of metal ions in the cathode film. One thus attempts to maintain as high a flow velocity of the electrolytes as possible. High velocities of flow, however, cause strong turbulent flows in the case of nozzle arrangements which are aimed perpendicularly against the surface to be treated. These flows, of course, further limit the magnitude of flow velocities.

It has further been found that methods and devices whereby such turbulent flows occur on the surfaces to be treated, in particular for the deposition of metals of the platinum group, are not suitable because the deposited layers tend toward fissure formation.

SUMMARY OF THE INVENTION

The invention is based upon the problem of creating a method and a device for the execution of the method with which not only are very high velocities of flow attainable, but rather with which also brittle layers of metals of the platinum group like rhodium, ruthenium and palladium, which tend toward fissure formation, can be deposited with short exposure times.

The inventive method consists in that the electrolyte solution is supplied via channels to the surface to be treated and is again removed from there in such a manner that on the surface to be treated, an almost laminar flow arises. Thereby, the velocity of flow of the electrolyte solution can be selected to be very high even in the case of metals of the Pt group.

It has further been found that in the case of an almost laminar flow on the surface to be treated, significantly higher current densities are allowable that in the case of turbulent flows, so that with this, significantly higher deposition velocities can be attained without fissure formation of the layers even at rather high temperatures. Experimental results show that even a temperature load of, for example, 350° C. is allowable without having a fissure formation of the layers occur.

By means of a defined electrolyte supply via flow-on channels and flow-off channels, a very much less turbulent flow is attained so that even metals of the Pt group can be deposited with a relatively high deposition velocity. It has proven to be advantageous when the flow-on and the flow-off angle of the channels is smaller than 45° with respect to the surface to be treated. It is further important that the cross-section of the flow-off channel is at least equal to the cross-section of the flow-on channel.

Particularly high deposition velocities can be attained in that the flow-on and flow-off angle of the channels with respect to the surface to be treated amounts to approximately 0°. Since practically no deflection of the electrolyte stream proceeds, extremely high velocities of flow of the electrolytes can be used.

The arrangement of the anodes can take place in the flow-on channel or the flow-off channel or in both channels. By means of the shape of the anodes, the layer growth can be influenced in a desired manner. Besides an embodiment of the anodes in the form of platinum tubes, platinum half-tubes and platinum strips, in particular with the embodiment of rectangular flow channels, the walls of the flow channel which lie opposite the surfaces to be coated can be designed as an anode.

BRIEF DESCRIPTION OF THE DRAWINGS

FIG. 1 shows an embodiment of the invention with electrolyte supply and removal arranged at an angle; and FIG. 2 shows an embodiment of the invention with parallel electrolyte supply and removal.

DESCRIPTION OF THE PREFERRED EMBODIMENTS

In FIG. 1, a plate 1 is designated which is to be partially galvanized on two places of the surface. In part 2 which serves as a covering or mask, and comprises a corrosion-resistant material, for example teflon, channels are provided for the electrolyte supply and removal. A flow-on channel 3 and a flow-off channel 4 are also shown. Arrows indicate the direction of flow of the electrolytes. The channels 3 and 4 can display a round or polygon cross-section, whereby both in the flow-on channel 3 as well as in the flow-off channel 4, there is arranged in each case one anode tube 5, or respectively, 6 for example made of Pt. The plate 1, which at least on the surface is electrically conducting, is connected as a cathode. The flow-on channel 3 is connected directly or indirectly via a distributor with a circulating pump, shown as the circulating unit 13 in the drawing.

As can be seen from the right part of FIG. 1, the electrodes 5' and 6' can be designed such that a specific layer thickness distribution arises. In the case of the embodiment example selected, the anode tubes 5' and 6' are aligned parallel to the plate 1.

FIG. 2 shows an embodiment example whereby a part 6 which is bent at a right angle on its lower side is to be provided with a layer. With the help of coverings 7 and 8, a supply channel 9 is formed for the electrolyte solution. A flat planar anode 10 is arranged opposite the surface to be coated on a wall. In order to obtain a uniform layer thickness over the total surface, it is practical, with the help of further covering parts 11, to form a defined flow-off channel 12. In particular, the embodiment example according to FIG. 2 permits very high flow velocities so that relatively high deposition velocities are attainable. Since here practically no turbulent flows occur, this embodiment is especially suitable for a galvanic coating with metals of the platinum group.

Although various minor modifications may be suggested by those versed in the art, it should be understood that we wish to embody within the scope of the patent warranted hereon, all such embodiments as reasonable and properly come within the scope of my contribution to the art.

We claim as our invention:

1. A method for the partial galvanization of a surface of a conductive material, comprising the steps of:
    supplying an electrolyte solution for use in depositing a metal or its alloy on the surface to be galvanized;
    providing a flow-on channel for supplying the electrolyte solution and a flow-off channel positioned at an angle relative to the surface to be treated of less than 45°;
    positioning the two channels to direct the electrolyte solution onto the surface to be treated such that a substantially laminar flow arises across the surface from the flow-on channel to the flow-off channel;
    providing the flow-on and flow-off channels of a corrosion-resistant material; and
    arranging a metallic anode element in each of the flow-on and flow-off channels directly adjacent to the area of which the surface to be treated is to be located, and providing the anode elements with a tunnel-like shape through which the electrolyte solution may flow.

2. A device for the partial galvanization of a surface of a material which is or has been made conducting, comprising: an electrolyte solution for use in depositing a metal or its alloy on the surface to be galvanized; a flow-on channel and a flow-off channel positioned at an angle relative to the surface of less than 45° and arranged to direct the electrolyte solution at an angle onto the surface to be treated where it is removed at an angle to the surface by the flow-off channel such that on the surface to be treated a substantially laminar flow arises; the flow-on channel and flow-off channel each being constructed of a corrosion-resistant material; and a metallic anode element arranged in at least one of the flow-on and flow-off channels.

3. A device according to claim 2 wherein a cross-section of the flow-off channel is at least equal to a cross-section of the flow-on channel.

4. A device according to claim 2 wherein an anode element is arranged in each of the flow-on and flow-off channels.

5. A device according to claim 2 wherein the flow-on and flow-off channels are circular in cross-section and the anode element is designed in the shape of an at least partial tube section.

6. A device according to claim 2 wherein the flow channels are rectangular in cross section and a wall of at least one of the flow channels which lies opposite the surface to be coated has an anode associated therewith.

7. A device for the partial galvanization of a surface of a conductive material, comprising: means for supplying an electrolyte solution for use in depositing a metal or its alloy on the surface to be galvanized; a flow-on channel connected to said means for supplying and a flow-off channel positioned at an angle relative to the surface to be treated of less than 45°, the two channels being positioned to direct the electrolyte solution onto the surface to be treated such that a substantially laminar flow arises across the surface from the flow-on channel to the flow-off channel; the flow-on channel and the flow-off channel each being constructed of a corrosion-resistant material; and a metallic anode element arranged in each of the flow-on and flow-off channels directly adjacent to the area at which the surface to be treated is to be located, each of said anode elements having a tunnel-like shape through which the electrolyte solution flows.

8. A device according to claim 7 wherein each of the sleeve-like anodes has an end adjacent the surface to be galvanized shaped so as to provide a specific layer thickness distribution.

9. A device according to claim 7 wherein the corrosion-resistant material comprises teflon.

10. A device according to claim 7 wherein each of the channels has a substantially circular cross-section and each of the anodes comprises a tube aligned within the channel and through which the electrolyte solution flows.

* * * * *